(12) United States Patent
Shin

(10) Patent No.: US 6,778,465 B2
(45) Date of Patent: Aug. 17, 2004

(54) CIRCUIT AND METHOD FOR GENERATING OUTPUT CONTROL SIGNAL IN SYNCHRONOUS SEMICONDUCTOR MEMORY DEVICE

(75) Inventor: Sang-woong Shin, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 40 days.

(21) Appl. No.: 10/290,285

(22) Filed: Nov. 8, 2002

(65) Prior Publication Data

US 2003/0090307 A1 May 15, 2003

(30) Foreign Application Priority Data

Nov. 12, 2001 (KR) ........................................ 2001-70135

(51) Int. Cl.[7] .............................................. G11C 8/00
(52) U.S. Cl. ...................................... 365/233; 365/194
(58) Field of Search ................................ 365/233, 194, 365/236, 189.01

(56) References Cited

U.S. PATENT DOCUMENTS 5,844,859 A    12/1998  Iwamoto et al.
6,125,064 A  * 9/2000   Kim et al. .................... 365/193
6,483,769 B2 * 11/2002  La .............................. 365/233
6,643,215 B2 * 11/2003  Kwak .......................... 365/233
6,707,759 B2 * 3/2004   Song ........................... 365/233

FOREIGN PATENT DOCUMENTS

JP    10-283779    10/1998
KR    2000-56514   9/2000

* cited by examiner

*Primary Examiner*—Anh Phung
(74) *Attorney, Agent, or Firm*—Lee & Sterba, P.C.

(57) ABSTRACT

An output control signal generating circuit in a synchronous semiconductor memory device preferably comprises 1) a plurality of selectable clock signal transfer circuits for selectively delaying an applied clock signal in order to generate an output control clock signal in response to a predetermined CAS latency signal, wherein each one of the plurality of selectable clock signal transfer circuits inserts one or more time delays into the output control clock signal, 2) a sampling circuit for generating a plurality of output signals from a read master signal, and 3) a selection circuit for selecting one of plurality of output signals, thereby indicating a valid data output time interval. A method for operating the output control signal generating circuit causes a clock signal to be delayed by a selectable number of additional clock cycles, thereby insuring the outputting of a data signal only at a time when the data is valid.

20 Claims, 6 Drawing Sheets

CIRCUIT AND METHOD FOR GENERATING OUTPUT CONTROL SIGNAL IN SYNCHRONOUS SEMICONDUCTOR MEMORY DEVICE

BACKGROUND OF THE INVENTION

1. Field of the Invention

The present invention relates to a synchronous semiconductor memory device and, more particularly, to a circuit and method for generating an output control signal in a synchronous semiconductor memory device.

2. Description of the Related Art

Semiconductor memory devices used as main memories in a computer system perform their role by inputting/outputting data to/from memory cells. The speeds of the data input/output operations of the semiconductor memory devices are important factors in determining the operating speed of the computer system. To improve the operating speed of the semiconductor memory devices, a synchronous dynamic random access memory (SDRAM, Synchronous DRAM) device in which internal circuits are controlled in synchronization with a generated clock signal from the computer system has been used.

Generally, the SDRAM uses a Column Address Strobe (CAS) latency function to increase an operation frequency. The CAS latency is defined as a time delay that is needed from the time of application of a read command before an outputted data signal can be presumed to be valid. This time delay can be represented as an integer number of cycles of a generated external clock signal with the read command being synchronized with that external clock.

Since the actual time delay (tAA) is constant for a given SDRAM, the CAS latency may be changed as a function of the operation frequency of the device. For example, if the tAA is 15 ns and the operation frequency is 200 MHz, the CAS latency becomes 3 because the period of the external clock signal is 5 ns. If the tAA is 15 ns and the operation frequency is 333 MHz, the CAS latency becomes 5 because the period of the external clock signal is 3 ns.

FIG. 1 illustrates a conventional output control signal generating circuit of a synchronous semiconductor memory device. Referring to FIG. 1, an output control signal generating circuit 100 includes a multiplexer 110 and a shift register 120.

The shift register 120 shifts a read master signal (RM) sequentially in response to an output control clock signal (PCLKDQ). PCLKD, which represents a signal generated through a delay locked-loop circuit (DLL, not shown) included in the synchronous semiconductor memory device, controls a data signal to be outputted in synchronization with the external clock signal (not shown). Typically, PCLKD is generated before the generation of the corresponding external clock signal in order to satisfy a condition where tAC (output data access time from external clock) is zero. A read master signal (RM), as a signal indicating the output interval of the data, is synchronized with an internal clock signal (not shown), which is the external clock signal delayed by a predetermined time.

The multiplexer 110 selectively outputs one of the output signals (RM_S1A, RM_S2A, RM_S3A, RM_S4A) of the shift register 120 as an output control signal (LATENCY) in response to CAS latency signals (CL2, CL3, CL4, CL5, respectively) indicating the activation of a CAS latency. The output control signal (LATENCY) is applied to an output buffer (not shown) included in the synchronous semiconductor memory device to cause the data to be outputted (i.e. activated) during an appropriate data output time interval.

FIG. 2 illustrates a timing diagram of the operation of the output control signal generating circuit shown in FIG. 1 when the CAS latency is 3. An internal clock signal (PCLK), which is generated from an external clock signal (ECLK) having a period TCC1, is delayed to time T1 from the rising edge of external clock (ECLK). An output control clock signal (PCLKDQ) is set such that it is generated earlier (T2 time) than the rising edge of a portion (ECLK1) of the external clock (ECLK).

A significant disadvantage of the circuit shown in FIG. 1 is that since the output control clock signal (PCLKDQ) typically leads the read master signal (RM), which is synchronized to the phase of the internal clock signal (PCLK), invalid read master signal (RM) may be sampled in the first cycle shown in FIG. 2 for an exemplary CAS latency of 3. To sample valid read master signal (RM), the output control clock signal (PCLKDQ) needs to be delayed by a time TD as shown in FIG. 2. The delay time (TD) and a resulting delayed output control clock signal (PCLKDQ_D) are shown in FIG. 2, and can be represented by the numerical expression, $$(TCC1-T2)+TD>T1, TD>T1-(TCC1-T2)$$

Generally, in a device using the DLL, the output control clock signal (PCLKDQ) is generated to occur earlier than the corresponding external clock signal in order to satisfy the tAC=0 condition, and the early activation time of PCLKDQ is set to be constant (i.e., independent of the operating frequency.) Thus, as the frequency of the external clock signal (ECLK) increases (that is, as the period (TCC1) of ECLK decreases), the delay time (TD) needs to be increased. Thus, since the conventional synchronization circuits have no provisions for variable synchronization delays, invalid output signals from output control signal generating circuit 100 may be generated at higher clock frequencies, thereby providing invalid output data from the SDRAM.

SUMMARY OF THE INVENTION

According to a feature of an embodiment of the present invention, there are provided a circuit and a method for generating an output control signal in a synchronous semiconductor memory device that is capable of varying a delay time of an output control clock signal in response to a CAS latency, and generating the output control signal by the output control clock signal having the different delay time.

According to a feature of an embodiment of the present invention, an output control signal generating circuit in a synchronous semiconductor memory device is provided which includes a clock signal transfer circuit for transferring an output control clock signal in response to a CAS latency, wherein the clock signal transfer circuit varies a total or at least one intermediate delay time of the output control clock signal controlling a data to be outputted in synchronization with an external clock signal, a sampling circuit for shifting sequentially a read master signal to generate a plurality of output signals, each one indicating an output interval of the data in response to the output control clock signal transferred through the clock signal transfer circuit, and a selection circuit for selecting one of the plurality of output signals of the sampling circuit, and for outputting the selected output signal as an output control signal in response to the CAS latency.

According to another feature of an embodiment of the present invention, the total delay time is needed for the first clocking of the read master signal, and is also needed so that an internal clock signal synchronizing the read master signal leads the output control clock signal in phase, and the internal clock signal is generated by delaying the external clock signal to a predetermined time.

According to another feature of an embodiment of the present invention, the maximum time needed for shifting the read master signal once in the sampling circuit is less than a period of the external clock signal.

According to another feature of an embodiment of the present invention, the clock signal transfer circuit includes, a first clock signal transfer circuit for transferring the output control clock signal to the sampling circuit when a CAS latency is 2, a second clock signal transfer circuit including a first and a second delay circuits for transferring the output control clock signal delayed to the extent of the total delay time through the first and the second delay circuits and the output control clock signal delayed through the second delay circuit to the sampling circuit respectively when the CAS latency is 3, a third clock signal transfer circuit including a third, a fourth and a fifth delay circuits for transferring the output control clock signal delayed to the extent of the total delay time through the third, the fourth and the fifth delay circuits, the output control clock signal delayed through the fourth and the fifth delay circuits, and the output control clock signal delayed through the fifth delay circuit to the sampling circuit respectively when the CAS latency is 4, and a fourth clock signal transfer circuit including a sixth, a seventh, a eighth and a ninth delay circuits for transferring the output control clock signal delayed to the extent of the total delay time through the sixth, the seventh, the eighth and the ninth delay circuits, the output control clock signal delayed through the seventh, the eighth and the ninth delay circuits, the output control clock signal delayed through the eighth and the ninth delay circuits, and the output control clock signal delayed through the ninth delay circuit to the sampling circuit respectively when the CAS latency is 5, wherein each delay time of a first delay time delayed through the first and the second delay circuits, a second delay time delayed through the third, the fourth and the fifth delay circuits, and a third delay time delayed through the sixth, the seventh, the eighth and the ninth delay circuits increases in the first to the third delay times sequence.

According to a feature of an embodiment of the present invention, a method for generating an output control signal in a synchronous semiconductor memory device is provided which includes the steps of a) transferring an output control clock signal in response to a CAS latency signal, wherein a total and an intermediate delay times of the output control clock signal controlling a data to be outputted in synchronization with an external clock signal are varied, b) shifting sequentially a read master signal indicating an output interval of the data in response to the output control clock signal transferred through the a) step, and c) selecting one of shifted read master signals in the b) step, and outputting the selected read master signal as an output control signal in response to the CAS latency signal.

According to another feature of an embodiment of the present invention, the total delay time is needed for the first clocking of the read master signal, and is also needed such that an internal clock signal synchronizing the read master signal leads the output control clock signal in phase, and the internal clock signal is generated by delaying the external clock signal to a predetermined time.

According to another feature of an embodiment of the present invention, the maximum time needed for shifting the read master signal once in the b) step is less than a period of the external clock signal.

Circuit and method for generating an output control signal in a synchronous semiconductor memory device of the present invention vary a total or at least one intermediate delay time of an output control clock signal according to a CAS latency, and may prevent the malfunction of the synchronous semiconductor memory device operating in high frequency by generating an output control signal from the output control clock signal having a different delay time.

In an alternate embodiment of the present invention, an output control signal generating circuit in a synchronous semiconductor memory device preferably comprises a plurality of selectable clock signal transfer circuits, each circuit providing at least one unique time delay to an applied clock signal, and a first selection means for enabling only one clock signal transfer circuit from the plurality of clock signal transfer circuits. The output control signal generating circuit also preferably includes: a sampling circuit for sampling an applied read master signal in response to at least one signal from the enabled clock signal transfer circuit and generating a plurality of output signals, each output signal representing the applied read master signal delayed by a unique amount of time; and a second selection means for outputting only one of the plurality of output signals.

These and other features and aspects of the present invention will be readily apparent to those of ordinary skill in the art upon review of the detailed description that follows.

DETAILED DESCRIPTION OF THE INVENTION

Korean Patent Application No. 2001-70135, filed on Nov. 12, 2001, and entitled: "Circuit and Method for Generating Output Control Signal in Synchronous Semiconductor Memory Device," is incorporated by reference herein in its entirety.

The present invention will be described more fully hereinafter with reference to the accompanying drawings, in which preferred embodiments of the present invention are shown. This invention may, however, be modified in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
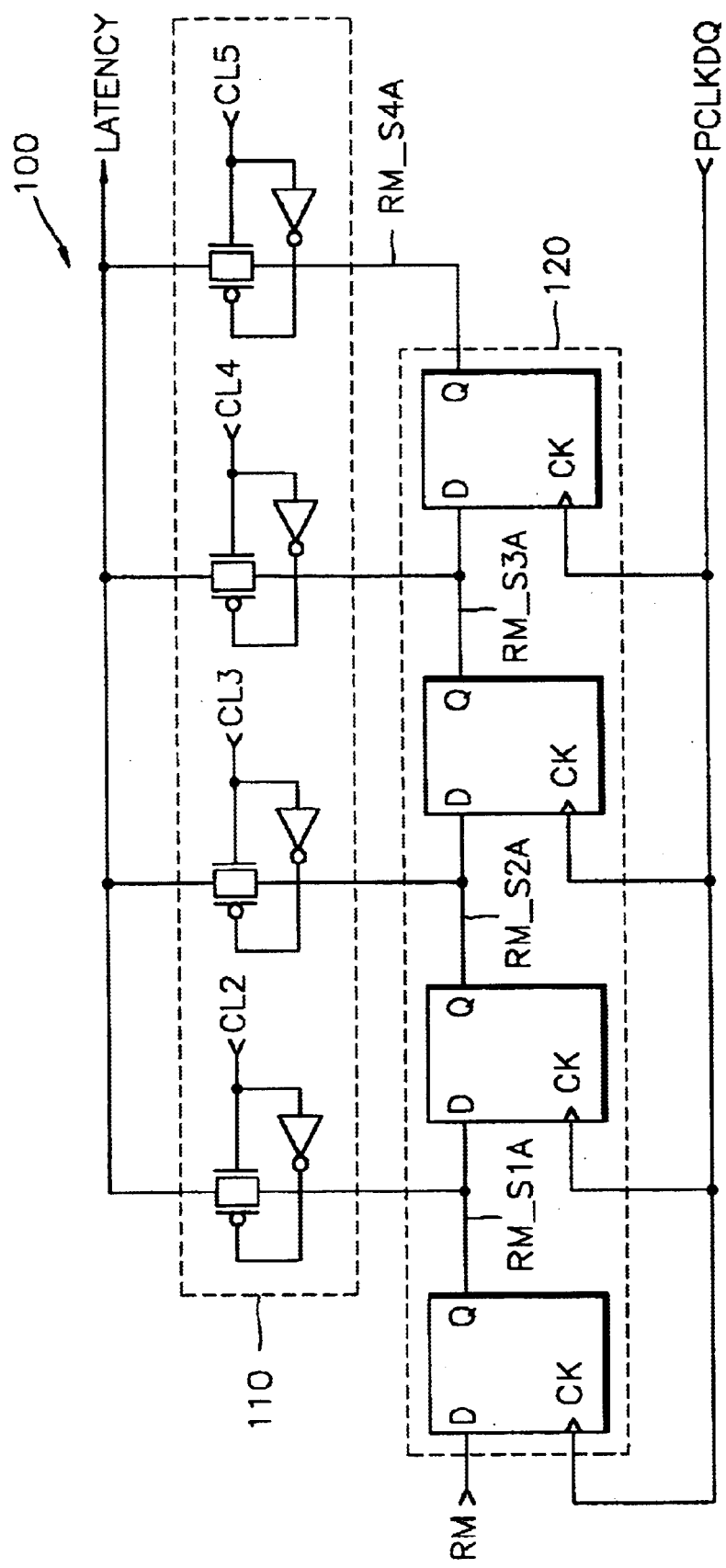
FIG. 1 illustrates a conventional output control signal generating circuit of a synchronous semiconductor memory device.
Figure 2:
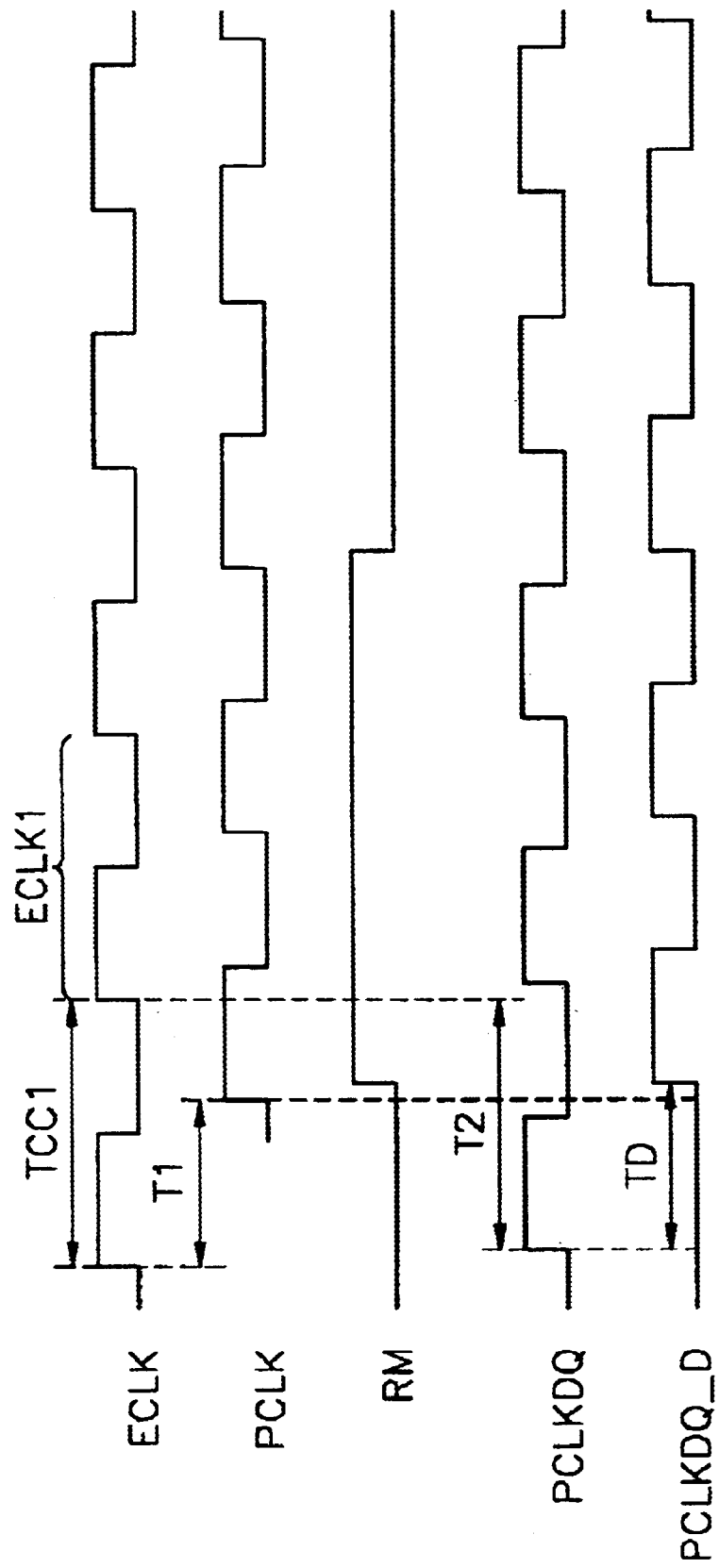
FIG. 2 illustrates a timing diagram of the operation of the output control signal generating circuit shown in FIG. 1 when a CAS latency is 3.
Figure 3:
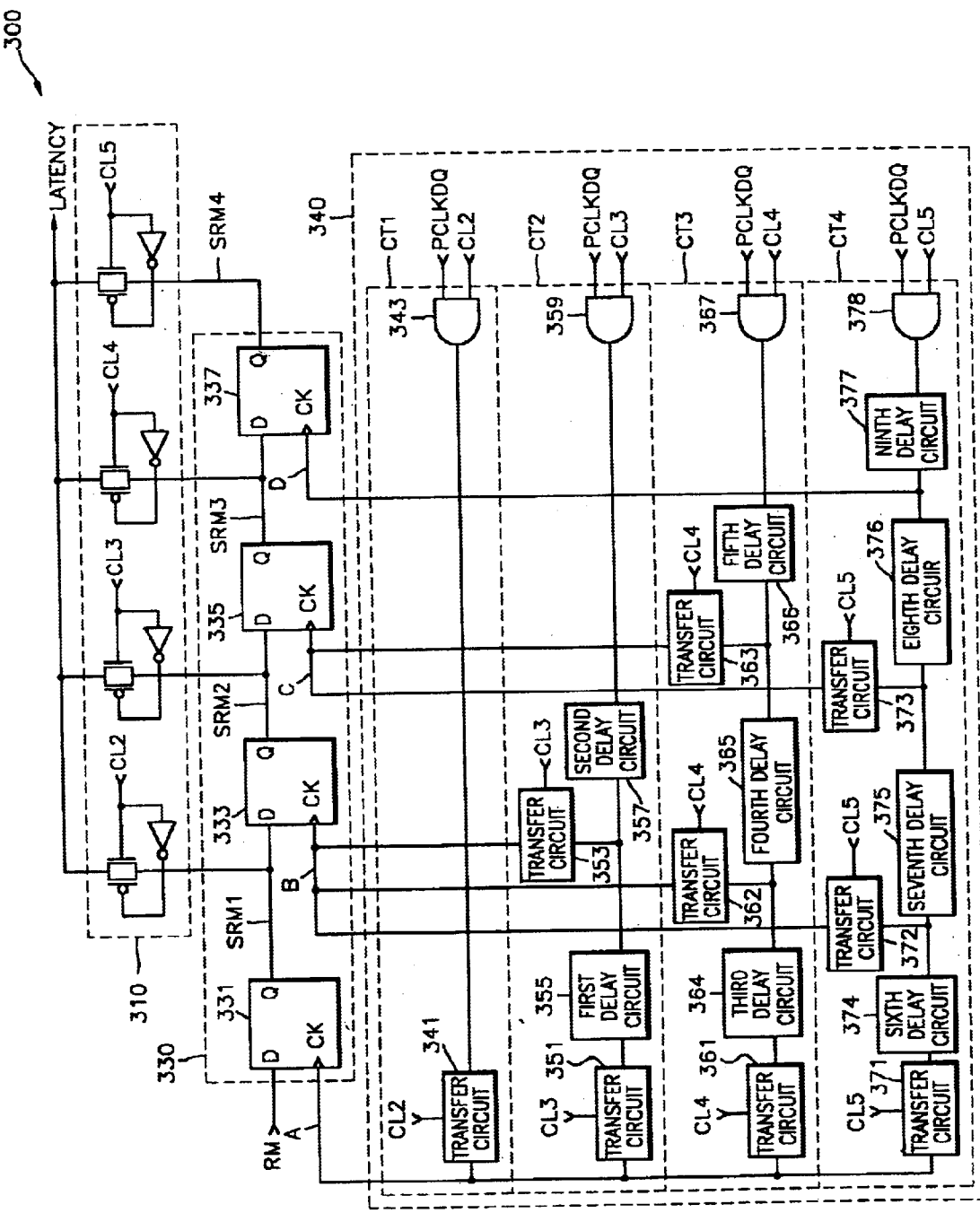
FIG. 3 illustrates an output control signal generating circuit of a synchronous semiconductor memory device according to a first embodiment of the present invention.

FIG. 3 illustrates an output control signal generating circuit of a synchronous semiconductor memory device according to a first embodiment of the present invention. Referring to FIG. 3, an output control signal generating circuit 300 preferably comprises a selection circuit 310, a sampling circuit 330 and a clock signal transfer circuit 340. The clock signal transfer circuit 340 further includes a first clock signal transfer circuit (CT1), a second clock signal transfer circuit (CT2), a third clock signal transfer circuit (CT3) and a fourth clock signal transfer circuit (CT4). The clock signal transfer circuits CT1 through CT4 are configured to provide individually selectable paths for uniquely delaying an output control clock signal (PCLKDQ.) The particular path selected is a function of the CAS latency desired, with each path being preferably gated by a logic circuit (i.e. an exemplary AND gate as shown in FIG. 3) that is controlled by an enabling signal, CL2 through CL5, respectively. In this way, a read master signal (RM) may be delayed for a controlled amount of time in order to allow the data to become valid before completing a read operation.

The first clock signal transfer circuit (CT1) preferably includes a transfer circuit 341 and a logical enabling circuit, such as an AND circuit 343. The AND circuit 343 transfers the output control clock signal (PCLKDQ) to the transfer circuit 341 in response to the activation of a first CAS latency signal (CL2) indicating that a CAS latency is 2. The transfer circuit 341 transfers the output control clock signal (PCLKDQ) to a node (A) in response to the first CAS latency signal (CL2). The transfer circuit 341 may include a transmission gate, as is known in the art. The output control clock signal (PCLKDQ), which may be a signal generated through a DLL circuit (not shown) included in the synchronous semiconductor memory device, controls a data signal to be outputted in synchronization with an external clock signal (not shown). PCLKDQ is preferably generated before the generation of the corresponding external clock signal for outputting the data signal in order to satisfy a condition where tAC (output data access time from external clock) is zero.

The second clock signal transfer circuit (CT2) preferably includes transfer circuits 351, 353, a first delay circuit 355, a second delay circuit 357 and a logical enabling circuit, such as an AND circuit 359. The AND circuit 359 transfers the output control clock signal (PCLKDQ) to the second delay circuit 357 in response to the activation of a second CAS latency signal (CL3) indicating that a CAS latency is 3. The transfer circuit 353 transfers the output control clock signal (PCLKDQ) delayed through the second delay circuit 357 to a node (B) in response to the second CAS latency signal (CL3). The output control clock signal (PCLKDQ) delayed through the second delay circuit 357 is also delayed through the first delay circuit 355, and is transferred to the transfer circuit 351. The transfer circuit 351 transfers the output control clock signal (PCLKDQ) delayed through the first and the second delay circuits 355, 357 to the node (A) in response to the second CAS latency signal (CL3). Each of the transfer circuits 351, 353 may include a transmission gate.

A first delay time by which the output control clock signal (PCLKDQ) is delayed through the first and the second delay circuits 355, 357 is needed for the first clocking of the read master signal (RM) in the sampling circuit 330 and is set such that an internal clock signal (not shown) synchronizing the read master signal (RM) leads the output control clock signal (PCLKDQ) in phase. The read master signal (RM) is a signal indicating an output interval for the data, and the internal clock signal is generated by delaying the external clock signal by a predetermined amount of time.

The third clock signal transfer circuit (CT3) preferably includes transfer circuits 361, 362, 363, a third, a fourth and a fifth delay circuits 364, 365, 366, and a logical enabling circuit, such as an AND circuit 367. The AND circuit 367 transfers the output control clock signal (PCLKDQ) to the fifth delay circuit 366 in response to the activation of a third CAS latency signal (CL4) indicating that a CAS latency is 4. The transfer circuit 363 transfers the output control clock signal (PCLKDQ) delayed through the fifth delay circuit 366 to a node (C) in response to the third CAS latency signal (CL4). The transfer circuit 362 transfers the output control clock signal (PCLKDQ) delayed through the fourth and the fifth delay circuits 365, 366 to the node (B) in response to the third CAS latency signal (CL4). The transfer circuit 361 transfers the output control clock signal (PCLKDQ) delayed through the third, the fourth and the fifth delay circuits 364, 365, 366 to the node (A) in response to the third CAS latency signal (CL4). Each of the transfer circuits 361, 362, 363 may include a transmission gate.

A second delay time by which the output control clock signal (PCLKDQ) is delayed through the third, the fourth and the fifth delay circuits 364, 365, 366 is needed for the first clocking of the read master signal (RM) in the sampling circuit 330 and is set such that the internal clock signal (not shown) synchronizing the read master signal (RM) leads the output control clock signal (PCLKDQ) in phase.

The fourth clock signal transfer circuit (CT4) preferably includes transfer circuits 371, 372, 373, a sixth, a seventh, a eighth and a ninth delay circuits 374, 375, 376, 377 and a logical enabling circuit, such as an AND circuit 378. The AND circuit 378 transfers an output control clock signal (PCLKDQ) to the ninth delay circuit 377 in response to the activation of a fourth CAS latency signal (CL5) indicating that a CAS latency is 5. The output control clock signal (PCLKDQ) delayed through the ninth delay circuit 377 is transferred to a node (D). The transfer circuit 373 transfers the output control clock signal (PCLKDQ) delayed through the eighth and the ninth delay circuits 376, 377 to the node (C) in response to the fourth CAS latency signal (CL5). The transfer circuit 372 transfers the output control clock signal (PCLKDQ) delayed through the seventh, the eighth and the ninth delay circuits 375, 376, 377 to the node (B) in response to the fourth CAS latency signal (CL5). The transfer circuit 371 transfers the output control clock signal (PCLKDQ) delayed through the sixth, the seventh, the eighth and the ninth delay circuits 374, 375, 376, 377 to the node (A) in response to the fourth CAS latency signal (CL5). Each of the transfer circuits 371, 372, 373 may include a transmission gate.

A third delay time by which the output control clock signal (PCLKDQ) is delayed through the sixth, the seventh, the eighth and the ninth delay circuits 374, 375, 376, 377 is needed for the first clocking of the read master signal (RM) in the sampling circuit 330 and is set such that the internal clock signal (not shown) synchronizing the read master signal (RM) leads the output control clock signal (PCLKDQ) in phase. In above the first to the third delay times (that is, each of total delay times corresponding to the second to the fourth clock signal transfer circuits (CT2~4)), the magnitude of the delay times increases in the first to the third delay times sequence.

The sampling circuit 330 preferably further includes four flip-flops 331, 333, 335, 337, which may be D flip-flops. The first flip-flop 331 samples the read master signal (RM), and outputs the sampled read master signal (RM) as a first read master signal (SRM1) in response to the output control clock signal (PCLKDQ) transferred to the node (A) through the clock signal transfer circuit 340. The second flip-flop 333 samples the first read master signal (SRM1), and outputs the sampled first read master signal (SRM1) as a second read master signal (SRM2) in response to the output control clock signal (PCLKDQ) transferred to the node (B) through the clock signal transfer circuit 340.

Similarly, the third flip-flop 335 samples the second read master signal (SRM2), and outputs the sampled second read master signal (SRM2) as a third read master signal (SRM3) in response to the output control clock signal (PCLKDQ) transferred to the node (C) through the clock signal transfer circuit 340. Finally, the fourth flip-flop 337 samples the third read master signal (SRM3), and outputs the sampled third read master signal (SRM3) as a fourth read master signal (SRM4) in response to the output control clock signal (PCLKDQ) transferred to the node (D) through the clock signal transfer circuit 340.

The time needed for shifting the read master signal (RM) once by the flip-flops included in the sampling circuit 330 is preferably less than a single period of the external clock signal. For example, when a CAS latency of 3 is selected, the time interval between the rising edge of the output control clock signal (PCLKDQ) at node A (i.e. delayed through the first and the second delay circuits 355, 357) to shift the read master signal (RM) and the rising edge of the output control clock signal (PCLKDQ) at Node B (i.e. delayed through the second delay circuit 357) to shift the first read master signal SRM1 is less than the period of the external clock signal.

In other words, each delay element of a selected delay path inserts a time delay such that the second flip flop 333 samples SRM1 after the first flip flop in the register chain (i.e. flip-flop 331) has sampled it's D input signal. Only on the next positive transition of delayed PCLKDQ will the output signal SRM1 of flip-flop 331 be sampled by flip-flop 333 and outputted as SRM2, thereby inserting a full period time delay. Similar operations apply to the remaining flip-flops in the register chain, with each flip-flop inserting an additional clock period time delay. Thus, the more stages that characterize a particular delay path, the more clock cycles are inserted. It can be appreciated that there are many ways to create the desired time delays, using both active and passive delay elements and using both digital and analog implementations, as are well-known in the art.

The selection circuit 310 preferably includes four transmission gates and four inverters. The selection circuit 310 selects one of the read master signals (SRM1, SRM2, SRM3, SRM4), and outputs the selected read master signal as an output control signal (LATENCY) in response to the CAS latency signals (CL2, CL3, CL4, CL5). The output control signal (LATENCY) is applied to an output buffer (not shown) included in the synchronous semiconductor memory device in order to insure that the data signal is activated and is outputted during an appropriate time interval of a read cycle.

Thus, the output control signal generating circuit 300 in the synchronous semiconductor memory device according to the first embodiment of the present invention varies both a total delay time and various intermediate delay times of an output control clock signal according to a desired CAS latency selectivity. Herein, the total delay time is needed for the first clocking of the read master signal RM in the sampling circuit 330, and each of the intermediated delay times is needed for the second, third or fourth clocking of the sampled read master signal in the sampling circuit 330. Such delay path selectivity allows for controllably generating a valid delayed output control signal that is in synchronization with the output control clock signal. From the foregoing, it should be evident to one having ordinary skill in the art that the present invention may be easily adopted to other cases where CAS latency may be any number.

Figure 4:
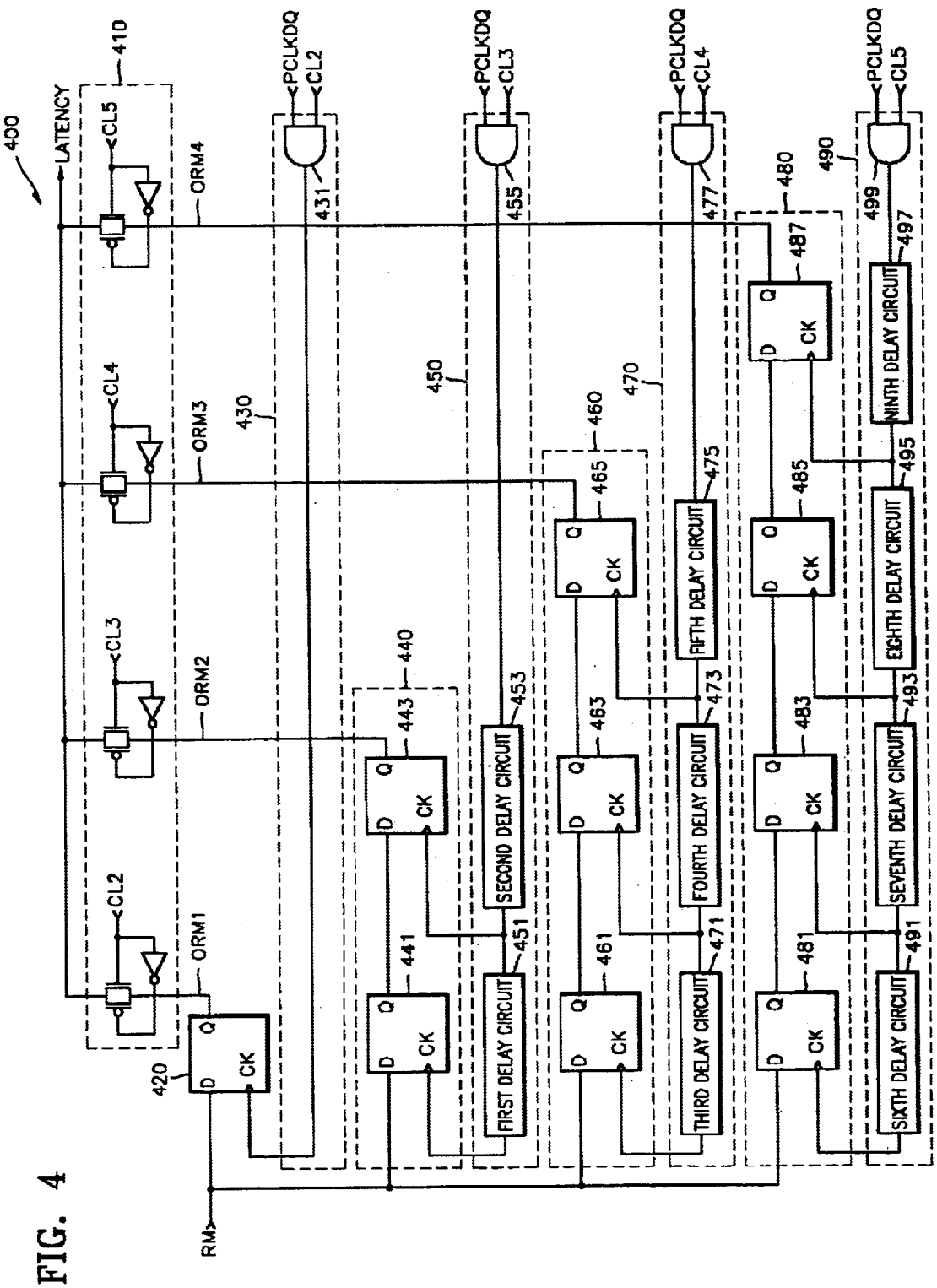
FIG. 4 illustrates an output control signal generating circuit of a synchronous semiconductor memory device according to a second embodiment of the present invention.

FIG. 4 illustrates an output control signal generating circuit of a synchronous semiconductor memory device according to a second embodiment of the present invention. Referring to FIG. 4, an output control signal generating circuit 400 preferably includes a selection circuit 410, four sampling circuits 420, 440, 460, 480 and four clock signal transfer circuits 430, 450, 470, 490.

The first clock signal transfer circuit 430 preferably includes an AND circuit 431, which transfers the output control clock signal (PCLKDQ) to a clock signal input terminal (CK) of the first transfer circuit 420 in response to the activation of a first CAS latency signal (CL2) indicating that a CAS latency is 2. The clocking of first transfer circuit 420 outputs the sampled read master signal (RM) as the first read master signal ORM1 as in the first embodiment. Similar to the first embodiment, the output control clock signal (PCLKDQ), which may be a signal generated through a DLL circuit (not shown) included in the synchronous semiconductor memory device, controls a data signal to be outputted in synchronization with the external clock signal (not shown). As in the first embodiment, PCKLDQ is preferably generated before the generation of the corresponding external clock signal for outputting the data to satisfy the condition where tAC (output data access time from external clock) is zero.

The second clock signal transfer circuit 450 includes a first delay circuit 451, a second delay circuit 453 and a logical enabling circuit, such as an AND circuit 455. The AND circuit 455 transfers the output control clock signal (PCLKDQ) to the second delay circuit 453 in response to the activation of the second CAS latency signal (CL3) indicating that a CAS latency is 3. The output control clock signal (PCLKDQ) delayed through the second delay circuit 453 is transferred to a clock signal input terminal (CK) of a flip-flop 443 included in the second sampling circuit 440. The output control clock signal (PCLKDQ) delayed through the first and the second delay circuits 451, 453 is transferred to a clock signal input terminal (CK) of a flip-flop 441 included in the second sampling circuit 440.

A fourth delay time by which the output control clock signal (PCLKDQ) is delayed through the first and the second delay circuits 451, 453 is needed for the first clocking of the read master signal (RM) in the second sampling circuit 440 and is set such that the internal clock signal (not shown) synchronizing the read master signal (RM) leads the output control clock signal (PCLKDQ) in phase. As in the first embodiment, the read master signal (RM) is a signal indicating an output interval for the data, and the internal clock signal is generated by delaying the external clock signal by a predetermined amount of time.

The third clock signal transfer circuit 470 preferably includes a third, a fourth and a fifth delay circuits 471, 473, 475 and a logical enabling circuit, such as an AND circuit 477. The AND circuit 477 transfers the output control clock signal (PCLKDQ) to the fifth delay circuit 475 in response to the activation of a third CAS latency signal (CL4)

indicating that a CAS latency is 4. The output control clock signal (PCLKDQ) delayed through the fifth delay circuit 475 is transferred to a clock signal input terminal (CK) of a flip-flop 465 included in the third sampling circuit 460. The output control clock signal (PCLKDQ) delayed through the fourth and the fifth delay circuits 473, 475 is transferred to a clock signal input terminal (CK) of a flip-flop 463 included in the third sampling circuit 460. The output control clock signal (PCLKDQ) delayed through the third, the fourth and the fifth delay circuits 471, 473, 475 is transferred to a clock signal input terminal (CK) of a flip-flop 461 included in the third sampling circuit 460.

A fifth delay time by which the output control clock signal (PCLKDQ) is delayed through the third, the fourth and the fifth delay circuits 471, 473, 475 is needed for the first clocking of the read master signal (RM) in the third sampling circuit 460 and is set such that the internal clock signal (not shown) synchronizing the read master signal (RM) leads the output control clock signal (PCLKDQ) in phase.

The fourth clock signal transfer circuit 490 preferably includes a sixth, a seventh, eighth and a ninth delay circuits 491, 493, 495, 497 and a logical enabling circuit, such as an AND circuit 499. The AND circuit 499 transfers the output control clock signal (PCLKDQ) to the ninth delay circuit 497 in response to the activation of a fourth CAS latency signal (CL5) indicating that a CAS latency is 5. The output control clock signal (PCLKDQ) delayed through the ninth delay circuit 497 is transferred to a clock signal input terminal (CK) of a flip-flop 487 included in the fourth sampling circuit 480. The output control clock signal (PCLKDQ) delayed through the eighth and the ninth delay circuits 495, 497 is transferred to a clock signal input terminal (CK) of a flip-flop 485 included in the fourth sampling circuit 480. The output control clock signal (PCLKDQ) delayed through the seventh, the eighth and the ninth delay circuits 493, 495, 497 is transferred to a clock signal input terminal (CK) of a flip-flop 483 included in the fourth sampling circuit 480. The output control clock signal (PCLKDQ) delayed through the sixth, the seventh, the eighth and the ninth delay circuits 491, 493, 495, 497 is transferred to a clock signal input terminal (CK) of a flip-flop 481 included in the fourth sampling circuit 480.

A sixth delay time by which the output control clock signal (PCLKDQ) is delayed through the sixth, the seventh, the eighth and the ninth delay circuits 491, 493, 495, 497 is needed for the first clocking of the read master signal (RM) in the fourth sampling circuit 480, and is set such that the internal clock signal (not shown) synchronizing the read master signal (RM) leads the output control clock signal (PCLKDQ) in phase. In above the fourth to the sixth delay times (that is, each of total delay times corresponding to the second to the fourth clock signal transfer circuits 450, 470, 490), the magnitude of the delay times increases in the fourth to the sixth delay times sequence.

The first sampling circuit 420 preferably includes a D flip-flop. As previously discussed, the D flip-flop samples the read master signal (RM) and outputs the sampled read master signal (RM) as a first read master signal (ORM1) in response to the output control clock signal (PCLKDQ) transferred from the first clock signal transfer circuit 430.

The second sampling circuit 440 preferably includes two D flip-flops 441, 443, wherein an output terminal (Q) of the D flip-flop 441 is connected to an input terminal (D) of the D flip-flop 443. The second sampling circuit 440 samples the read master signal (RM) and outputs the sampled read master signal (RM) as the second read master signal (ORM2) in response to the output control clock signal (PCLKDQ) delayed through the first and the second delay circuits 451, 453 and the output control clock signal (PCLKDQ) delayed through the second delay circuit 453.

The third sampling circuit 460 preferably includes three D flip-flops 461, 463, 465. An output terminal (Q) of the D flip-flop 461 is connected to an input terminal (D) of the D flip-flop 463, and an output terminal (Q) of the D flip-flop 463 is connected to an input terminal (D) of the D flip-flop 465. The third sampling circuit 460 samples the read master signal (RM), and outputs the sampled read master signal (RM) as a third read master signal (ORM3) in response to the output control clock signal (PCLKDQ) delayed through the third, the fourth and the fifth delay circuits 471, 473, 475, the output control clock signal (PCLKDQ) delayed through the fourth and the fifth delay circuits 473, 475 and the output control clock signal (PCLKDQ) delayed through the fifth delay circuit 475.

The fourth sampling circuit 480 preferably includes four D flip-flops 481, 483, 485, 487. An output terminal (Q) of the D flip-flop 481 is connected to an input terminal (D) of the D flip-flop 483, an output terminal (Q) of the D flip-flop 483 is connected to an input terminal (D) of the D flip-flop 485, and an output terminal (Q) of the D flip-flop 485 is connected to an input terminal (D) of the D flip-flop 487. The fourth sampling circuit 480 samples the read master signal (RM), and outputs the sampled read master signal (RM) as a fourth read master signal (ORM4) in response to the output control clock signal (PCLKDQ) delayed through the sixth, the seventh, the eighth and the ninth delay circuits 491, 493, 495, 497, the output control clock signal (PCLKDQ) delayed through the seventh, the eighth and the ninth delay circuits 493, 495, 497, the output control clock signal (PCLKDQ) delayed through the eighth and the ninth delay circuits 495, 497 and the output control clock signal (PCLKDQ) delayed through the ninth delay circuit 497.

Similar to the first embodiment, the time needed for shifting the read master signal (RM) once by the D flip-flops included in the sampling circuits 440, 460, 480 is less than a period of the external clock signal. For example, when the CAS latency is 3, the time interval between the rising edge of the output control clock signal (PCLKDQ) delayed through the first and the second delay circuits 451, 453 to shift the read master signal (RM) and the rising edge of the output control clock signal (PCLKDQ) delayed through the second delay circuit 453 to shift the shifted read master signal (RM) is less than the period of the external clock signal.

The selection circuit 410 preferably includes four transmission gates and four inverters. The selection circuit 410 selects one of the read master signals (ORM1, ORM2, ORM3, and ORM4), and outputs the selected read master signal as an output control signal (LATENCY) in response to the CAS latency signals (CL2, CL3, CL4, and CL5).

Figure 5:
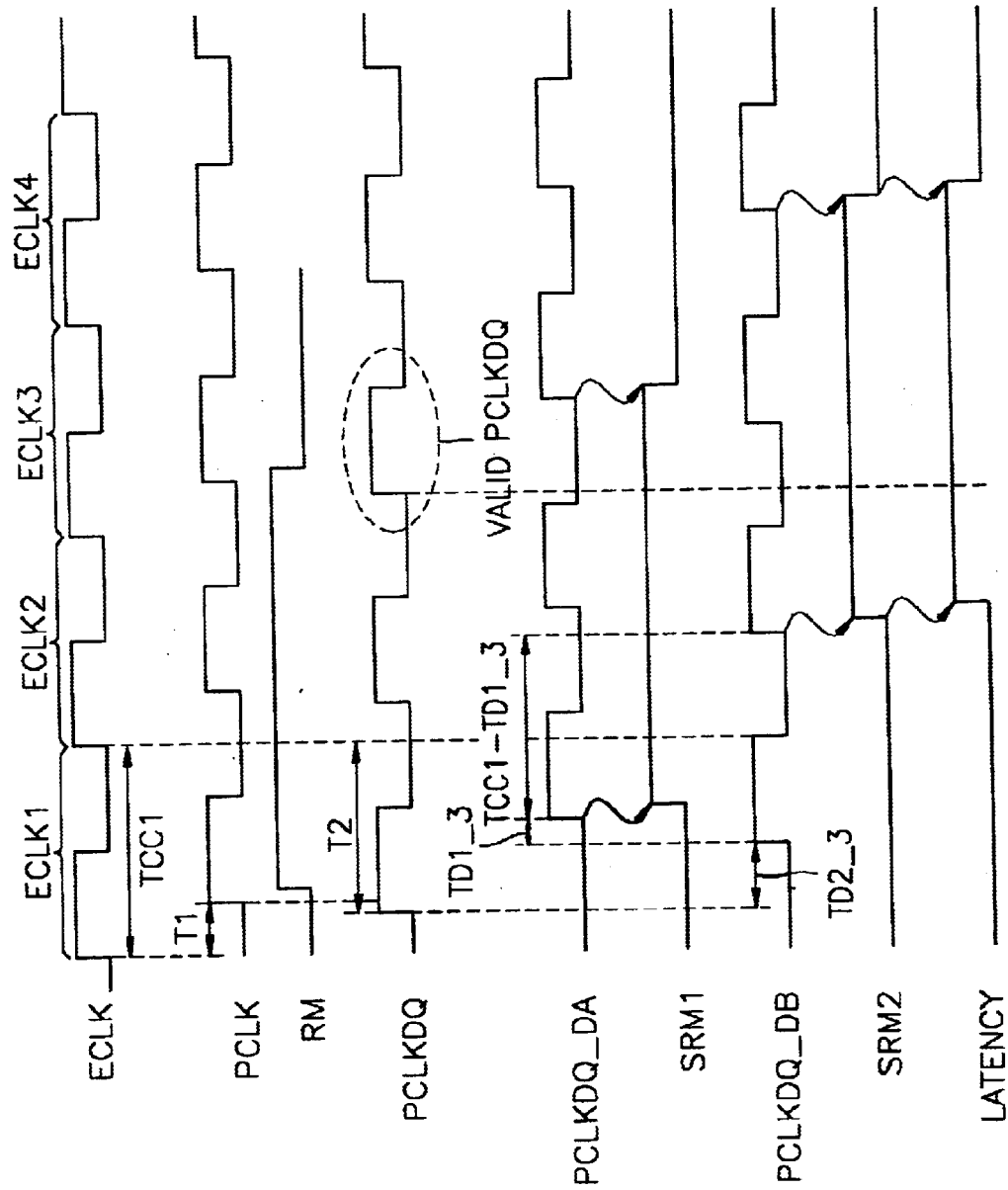
FIG. 5 illustrates an exemplary timing diagram of the operation of an output control signal generating circuit of a synchronous semiconductor memory device according to the first embodiment of the present invention when a CAS latency is 3.

FIG. 5 illustrates an exemplary timing diagram of the preferred operation of an output control signal generating circuit of a synchronous semiconductor memory device according to the first embodiment of the present invention when the CAS latency is 3.

A read command is applied in synchronization with the rising edge of a portion (ECLK1) of an external clock signal (ECLK) having a period of TCC1. An internal clock signal (PCLK) is also generated in synchronization with the rising edge of the portion (ECLK1) of the external clock signal (ECLK) and is delayed by time T1 from the external clock signal (ECLK). A read master signal (RM) is generated in synchronization with the internal clock signal (PCLK). An output control clock signal (PCLKDQ) also having a period of TCC1 is generated to rise earlier (time T2) than the rising edge of a portion (ECLK2) of the external clock signal (ECLK). The time indicated as "VALID PCLKDQ" on the output control clock signal (PCLKDQ) in FIG. 5 controls a data signal to be outputted in synchronization with a rising edge of a portion (ECLK4) of the external clock signal (ECLK). That is, when the CAS latency is 3, a first valid data is outputted in the fourth external clock cycle (ECLK4) after the read command is applied. Also, the output control clock signal (PCLKDQ) corresponding to the fourth external clock cycle (ECLK4) is activated earlier than the fourth external clock cycle (ECLK4) to satisfy the tAC=0 condition.

A first output control clock signal (PCLKDQ_DA) is generated through the first and the second delay circuits 355, 357 of FIG. 3 after a delay time (TD2_3+TD1_3) from the output control clock signal (PCLKDQ) and is transferred to the node (A). Herein, the delay time (TD2_3+TD1_3) is the time needed to sample the read master signal (RM). The first output control clock signal (PCLKDQ_DA) generates the first read master signal (SRM1) by sampling the read master signal (RM).

A second output control clock signal (PCLKDQ_DB) is generated through the second delay circuits 357 of FIG. 3 after a delay time (TD2_3) from the output control clock signal (PCLKDQ), and is transferred to the node (B). The second output control clock signal (PCLKDQ_DB) generates the second read master signal (SRM2) by sampling the first read master signal (SRM1) in the second rising edge of the second output control clock signal (PCLKDQ_DB). The second read master signal (SRM2) is subjected to a natural propagation delay and is generated as an output control signal (LATENCY) through the application of the second CAS latency signal (CL3) to selection circuit 310. In FIG. 5, it can be understood that the "VALID PLKDQ" is included in the time interval in which the output control signal (LATENCY) is activated as logic high state. In the rising edge of a portion (ECLK4) of the external clock signal (ECLK), the data may be outputted as satisfying the tAC=0 condition.

The time interval between the first rising edge of the first output control clock signal (PLCKDQ_DA) sampling the read master signal (RM) and the second rising edge of the second output control clock signal (PLCKDQ_DB) sampling the first read master signal (SRM1) is TCC1−TD1_3. Thus, because the time interval is less than the period (TCC1) of the external clock signal (ECLK), the time for sampling the read master signal (RM) after first clocking can be reduced.

Figure 6:
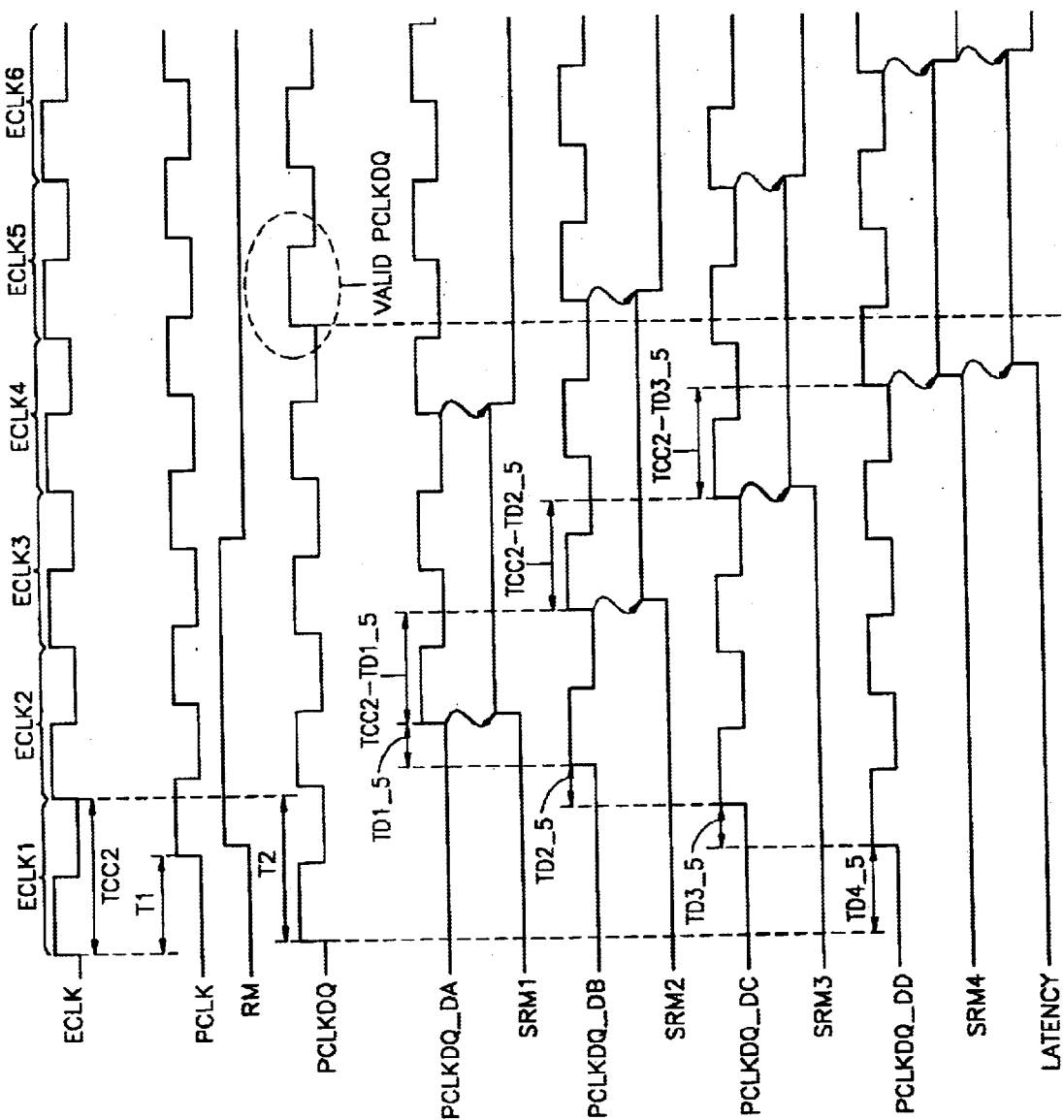
FIG. 6 illustrates an exemplary timing diagram of the operation of an output control signal generating circuit of a synchronous semiconductor memory device according to the first embodiment of the present invention when a CAS latency is 5.

FIG. 6 illustrates an exemplary timing diagram of the operation of an output control signal generating circuit of a synchronous semiconductor memory device according to the first embodiment of the present invention when the CAS latency is 5.

A read command is applied in synchronization with a rising edge of a portion (ECLK1) of an external clock signal (ECLK) having a period of TCC2. The internal clock signal (PCLK) is also generated in synchronization with the rising edge of the portion (ECLK1) of the external clock signal (ECLK), and is delayed by time T1 from the rising edge of external clock signal (ECLK). The read master signal (RM) is generated in synchronization with the internal clock signal (PCLK). An output control clock signal (PCLKDQ) having a period of TCC2 is generated having a rising edge occuring earlier (T2 time) than the rising edge of a portion (ECLK2) of the external clock signal (ECLK). The time indicated as "VALID PCLKDQ" on the output control clock signal (PCLKDQ) in FIG. 6 controls a data signal to be outputted in synchronization with a rising edge of a portion (ECLK6) of the external clock signal (ECLK). That is, when a CAS latency is 5, a first valid data is outputted in the sixth external clock cycle (ECLK6) after the read command is applied. Also, the output control clock signal (PCLKDQ) corresponding to the sixth external clock cycle (ECLK6) is activated earlier than the sixth external clock cycle (ECLK6) to satisfy the tAC=0 condition.

A first output control clock signal (PCLKDQ_DA) is generated through the sixth, the seventh, the eighth and the ninth delay circuits 374, 375, 376, 377 of FIG. 3 after a delay time (TD1_5+TD2_5+TD3_5+TD4_5) from the output control clock signal (PCLKDQ), and is transferred to the node (A). Herein, the delay time (TD1_5+TD2_5+TD3_5+TD4_5) is the time needed to sample the valid read master signal (RM). The first output control clock signal (PCLKDQ_DA) generates the first read master signal (SRM1) by sampling the read master signal (RM).

A second output control clock signal (PCLKDQ_DB) is generated through the seventh, the eighth and ninth delay circuits 375, 376, 377 of FIG. 3 after a delay time (TD2_5+TD3_5+TD4_5) from the output control clock signal (PCLKDQ), and is transferred to the node (B). The second output control clock signal (PCLKDQ_DB) generates the second read master signal (SRM2) by sampling the first read master signal (SRM1) in the second rising edge of the second output control clock signal (PCLKDQ_DB).

A third output control clock signal (PCLKDQ_DC) is generated through the eighth and ninth delay circuits 376, 377 of FIG. 3 after a delay time (TD3_5+TD4_5) from the output control clock signal (PCLKDQ), and is transferred to the node (C). The third output control clock signal (PCLKDQ_DC) generates the third read master signal (SRM3) by sampling the second read master signal (SRM2) in the third rising edge of the third output control clock signal (PCLKDQ_DC).

A fourth output control clock signal (PCLKDQ_DD) is generated through the ninth delay circuit 377 of FIG. 3 after a delay time (TD4_5) from the output control clock signal (PCLKDQ), and is transferred to the node (D). The fourth output control clock signal (PCLKDQ_DD) generates the fourth read master signal (SRM4) by sampling the third read master signal (SRM3) in the fourth rising edge of the fourth output control clock signal (PCLKDQ_DD). The fourth read master signal (SRM4) is delayed, and is generated as an output control signal (LATENCY) through the application of the fourth CAS latency signal (CL5) to selection circuit 310. In FIG. 6, it can be understood that the "VALID PLKDQ" is included in the time interval in which the output control signal (LATENCY) is activated as logic high state. In the rising edge of a portion (ECLK6) of the external clock signal (ECLK), the data may be outputted as satisfying the tAC=0 condition.

The time interval between the first rising edge of the first output control clock signal (PLCKDQ_DA) sampling the read master signal (RM) and the second rising edge of the second output control clock signal (PLCKDQ_DB) sampling the first read master signal (SRM1) is TCC2−TD1_5. The time interval between the second rising edge of the second output control clock signal (PLCKDQ_DB) sampling the first read master signal (SRM1) and the third rising edge of the third output control clock signal (PLCKDQ_DC) sampling the second read master signal (SRM2) is TCC2-TD2_5. And, The time interval between the third rising edge of the third output control clock signal (PLCKDQ_DC) sampling the second read master signal (SRM2) and the fourth rising edge of the fourth output control clock signal (PLCKDQ_DD) sampling the third read master signal (SRM3) is TCC2-TD3_5. Thus, because the time intervals (TCC2-TD1_5, TCC2-TD2_5, TCC2-TD3_5) are each less than the period (TCC2) of the external clock signal (ECLK), the time for sampling the read master signal (RM) after first clocking may be reduced.

It can be appreciated by one having ordinary skill in the art that timing diagrams illustrating the operation of an output control signal generating circuit of a synchronous semiconductor memory device according to the second embodiment of the present invention shown in FIG. 4 would be similar to the timing diagrams discussed above with reference to FIGS. 5 and 6 for the first embodiment shown in FIG. 3. Therefore, duplicated explanations are omitted herein for brevity.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. An output control signal generating circuit in a synchronous semiconductor memory device, comprising:
   a clock signal transfer circuit for transferring an output control clock signal in response to a CAS latency signal, wherein the clock signal transfer circuit varies a total or at least one intermediate delay time of the output control clock signal controlling a data to be outputted in synchronization with an external clock signal;
   a sampling circuit for shifting sequentially a read master signal and to generate a plurality of output signals, each one indicating an output interval of the data in response to the output control clock signal transferred through the clock signal transfer circuit; and
   a selection circuit for selecting one of the plurality of output signals of the sampling circuit, and for outputting the selected output signal as an output control signal in response to the CAS latency signal.

2. The output control signal generating circuit as claimed in claim 1, wherein the total delay time controls the first clocking of the read master signal, and is characterized such that an internal clock signal synchronizing the read master signal leads the output control clock signal in phase, and wherein the internal clock signal is generated by delaying the external clock signal by a predetermined time.

3. The output control signal generating circuit as claimed in claim 2, wherein the maximum time of a single shift of the read master signal is less than a period of the external clock signal.

4. The output control signal generating circuit as claimed in claim 3, wherein the clock signal transfer circuit includes:
   a first clock signal transfer circuit for transferring the output control clock signal to the sampling circuit when a CAS latency is 2; and
   a second clock signal transfer circuit including a first and a second delay circuits for transferring the output control clock signal delayed to the extent of the total delay time through the first and the second delay circuits and the output control clock signal delayed through the second delay circuit to the sampling circuit respectively when the CAS latency is 3.

5. The output control signal generating circuit as claimed in claim 4, wherein the clock signal transfer circuit further includes:
   a third clock signal transfer circuit including a third, a fourth and a fifth delay circuits for transferring the output control clock signal delayed to the extent of the total delay time through the third, the fourth and the fifth delay circuits, the output control clock signal delayed through the fourth and the fifth delay circuits, and the output control clock signal delayed through the fifth delay circuit to the sampling circuit respectively when the CAS latency is 4; and
   a fourth clock signal transfer circuit including a sixth, a seventh, a eighth and a ninth delay circuits for transferring the output control clock signal delayed to the extent of the total delay time through the sixth, the seventh, the eighth and the ninth delay circuits, the output control clock signal delayed through the seventh, the eighth and the ninth delay circuits, the output control clock signal delayed through the eighth and the ninth delay circuits, and the output control clock signal delayed through the ninth delay circuit to the sampling circuit respectively when the CAS latency is 5,
   wherein each delay time of a first delay time delayed through the first and the second delay circuits, a second delay time delayed through the third, the fourth and the fifth delay circuits, and a third delay time delayed through the sixth, the seventh, the eighth and the ninth delay circuits increases in the first to the third delay times sequence.

6. The output control signal generating circuit as claimed in claim 5, wherein the sampling circuit includes:
   a first flip-flop for shifting the read master signal in response to the output control clock signal transferred through the first, the second, the third and the fourth clock signal transfer circuits;
   a second flip-flop for shifting an output signal of the first flip-flop in response to the output control clock signal transferred through the second, the third and the fourth clock signal transfer circuits;
   a third flip-flop for shifting an output signal of the second flip-flop in response to the output control clock signal transferred through the third and the fourth clock signal transfer circuits; and
   a fourth flip-flop for shifting an output signal of the third flip-flop in response to the output control clock signal transferred through the fourth clock signal transfer circuit.

7. The output control signal generating circuit as claimed in claim 6, wherein the first clock signal transfer circuit includes:
   a first enabling gate circuit for buffering the output control clock signal in response to the activation of a first CAS latency signal indicating that the CAS latency is 2; and
   a transfer circuit for transferring the output control clock signal outputted from the first enabling gate circuit to the sampling circuit in response to the first CAS latency signal.

8. The output control signal generating circuit as claimed in claim 6, wherein the second clock signal transfer circuit further includes:
   a second enabling gate circuit for buffering the output control clock signal and for transferring the buffered output control clock signal to the second delay circuit in response to the activation of a second CAS latency signal indicating that the CAS latency is 3;
a first transfer circuit for transferring the output control clock signal delayed through the second delay circuit to the sampling circuit in response to the second CAS latency signal; and
a second transfer circuit for transferring the output control clock signal delayed through the first and the second delay circuits to the sampling circuit in response to the second CAS latency signal.

9. The output control signal generating circuit as claimed in claim 6, wherein the third clock signal transfer circuit further includes:
a third enabling gate circuit for buffering the output control clock signal and for transferring the buffered output control clock signal to the fifth delay circuit in response to the activation of a third CAS latency signal indicating that the CAS latency is 4;
a first transfer circuit for transferring the output control clock signal delayed through the fifth delay circuit to the sampling circuit in response to the third CAS latency signal;
a second transfer circuit for transferring the output control clock signal delayed through the fourth and the fifth delay circuits to the sampling circuit in response to the third CAS latency signal; and
a third transfer circuit for transferring the output control clock signal delayed through the third, the fourth and the fifth delay circuits to the sampling circuit in response to the third CAS latency signal.

10. The output control signal generating circuit as claimed in claim 6, wherein the fourth clock signal transfer circuit further includes:
a fourth enabling gate circuit for buffering the output control clock signal and for transferring the buffered output control clock signal to the ninth delay circuit in response to the activation of a fourth CAS latency signal indicating that the CAS latency is 5;
a first transfer circuit for transferring the output control clock signal delayed through the eighth and the ninth delay circuits to the sampling circuit in response to the fourth CAS latency signal;
a second transfer circuit for transferring the output control clock signal delayed through the seventh, the eighth and the ninth delay circuits to the sampling circuit in response to the fourth CAS latency signal; and
a third transfer circuit for transferring the output control clock signal delayed through the sixth, the seventh, the eighth and the ninth delay circuits to the sampling circuit in response to the fourth CAS latency signal.

11. The output control signal generating circuit as claimed in claim 5, wherein the sampling circuit includes:
a first sampling circuit for sampling the read master signal, for outputting the sampled read master signal as a first read master signal, and for transferring the first read master signal to the selection circuit in response to the output control clock signal transferred through the first clock signal transfer circuit;
a second sampling circuit for sampling the read master signal, for outputting the sampled read master signal as a second read master signal, and for transferring the second read master signal to the selection circuit in response to the output control clock signal transferred through the first and the second delay circuits and the output control clock signal transferred through the second delay circuit;
a third sampling circuit for sampling the read master signal, for outputting the sampled read master signal as a third read master signal, and for transferring the third read master signal to the selection circuit in response to the output control clock signal transferred through the third, the fourth and the fifth delay circuits, the output control clock signal transferred through the fourth and the fifth delay circuits and the output control clock signal transferred through the fifth delay circuit; and
a fourth sampling circuit for sampling the read master signal, for outputting the sampled read master signal as a fourth read master signal, and for transferring the fourth read master signal to the selection circuit in response to the output control clock signal transferred through the sixth, the seventh, the eighth and the ninth delay circuits, the output control clock signal transferred through the seventh, the eighth and the ninth delay circuits, the output control clock signal transferred through the eighth and the ninth delay circuits and the output control clock signal transferred through the ninth delay circuit.

12. The output control signal generating circuit as claimed in claim 11, wherein the first clock signal transfer circuit includes:
a first enabling gate circuit for buffering the output control clock signal in response to the activation of a first CAS latency signal indicating that the CAS latency is 2,
wherein the output control clock signal outputted from the first enabling gate circuit is transferred to the sampling circuit.

13. The output control signal generating circuit as claimed in claim 11, wherein the second clock signal transfer circuit further includes:
a second enabling gate circuit for buffering the output control clock signal in response to the activation of a second CAS latency signal indicating that the CAS latency is 3,
wherein the output control clock signal outputted from the second enabling gate circuit is transferred to the second delay circuit.

14. The output control signal generating circuit as claimed in claim 11, wherein the third clock signal transfer circuit further includes:
a third enabling gate circuit for buffering the output control clock signal in response to the activation of a third CAS latency signal indicating that the CAS latency is 4,
wherein the output control clock signal outputted from the third enabling gate circuit is transferred to the fifth delay circuit.

15. The output control signal generating circuit as claimed in claim 11, wherein the fourth clock signal transfer circuit further includes:
a fourth enabling gate circuit for buffering the output control clock signal in response to the activation of a fourth CAS latency signal indicating that the CAS latency is 5,
wherein the output control clock signal outputted from the fourth enabling gate circuit is transferred to the ninth delay circuit.

16. A method for generating an output control signal in a synchronous semiconductor memory device, comprising:
a) transferring an output control clock signal in response to a CAS latency signal, wherein a total and an intermediate delay times of the output control clock signal controlling a data to be outputted in synchronization with an external clock signal are varied;

b) shifting sequentially a read master signal indicating an output interval of the data in response to the output control clock signal transferred through the a) step; and c) selecting one of shifted read master signals in the b) step, and outputting the selected read master signal as an output control signal in response to the CAS latency.

17. The method as claimed in claim 16, wherein the total delay time controls the first clocking of the read master signal, and is characterized such that an internal clock signal synchronizing the read master signal leads the output control clock signal in phase, and the internal clock signal is generated by delaying the external clock signal to a predetermined time.

18. The method as claimed in claim 17, wherein the maximum time of a single shift of the read master signal in the b) step is less than a period of the external clock signal.

19. The method as claimed in claim 18, wherein the b) step shifts the read master signal in response to the output control clock signal delayed to the extent of the total delay time through a first and a second delay circuits, and shifts the shifted read master signal in response to the output control clock signal delayed through the second delay circuit when a CAS latency is 3.

20. An output control signal generating circuit in a synchronous semiconductor memory device, comprising:

a plurality of selectable clock signal transfer circuits, each circuit providing at least one unique time delay to an applied clock signal;

a first selection means for enabling only one clock signal transfer circuit from the plurality of clock signal transfer circuits;

a sampling circuit for sampling an applied read master signal in response to at least one signal from the enabled clock signal transfer circuit and generating a plurality of output signals, each one representing the applied read master signal delayed by a unique amount of time; and a second selection means for outputting only one of the plurality of output signals.

* * * * *